(12) United States Patent
Colinge et al.

(10) Patent No.: US 9,653,604 B1
(45) Date of Patent: May 16, 2017

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Jean-Pierre Colinge, Hsinchu (TW); Carlos H. Diaz, Mountain View, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/058,672

(22) Filed: Mar. 2, 2016

Related U.S. Application Data

(60) Provisional application No. 62/273,361, filed on Dec. 30, 2015.

(51) Int. Cl.
| | |
|---|---|
| *H01L 27/108* | (2006.01) |
| *H01L 29/78* | (2006.01) |
| *H01L 29/66* | (2006.01) |
| *H01L 29/06* | (2006.01) |
| *H01L 29/45* | (2006.01) |

(Continued)

(52) U.S. Cl.
CPC ...... *H01L 29/785* (2013.01); *H01L 21/02532* (2013.01); *H01L 21/02592* (2013.01); *H01L 21/02667* (2013.01); *H01L 21/465* (2013.01); *H01L 29/0649* (2013.01); *H01L 29/45* (2013.01); *H01L 29/665* (2013.01); *H01L 29/6653* (2013.01); *H01L 29/6656* (2013.01); *H01L 29/66795* (2013.01)

(58) Field of Classification Search
CPC .......... H01L 21/823418–21/823431; H01L 21/823814–21/823821; H01L 21/845; H01L 27/0886–27/0924; H01L 27/10826; H01L 27/10879; H01L 21/02425; H01L 21/2257; H01L 21/28052; H01L 21/28061; H01L 21/28518; H01L 21/32051–21/32055; H01L 21/76889; H01L 21/76897; H01L 23/53209; H01L 28/24; H01L 29/4933
See application file for complete search history.

(56) References Cited

U.S. PATENT DOCUMENTS

| | | |
|---|---|---|
| 8,487,378 B2 | 7/2013 | Goto et al. |
| 8,729,634 B2 | 5/2014 | Shen et al. |
| 8,826,213 B1 | 9/2014 | Ho et al. |

(Continued)

*Primary Examiner* — Cuong B Nguyen
(74) *Attorney, Agent, or Firm* — McDermott Will & Emery LLP

(57) ABSTRACT

A semiconductor device includes a fin structure disposed over a substrate, a gate structure and a source. The fin structure includes an upper layer being exposed from an isolation insulating layer. The gate structure disposed over part of the upper layer of the fin structure. The source includes the upper layer of the fin structure not covered by the gate structure. The upper layer of the fin structure of the source is covered by a crystal semiconductor layer. The crystal semiconductor layer is covered by a silicide layer formed by Si and a first metal element. The silicide layer is covered by a first metal layer. A second metal layer made of the first metal element is disposed between the first metal layer and the isolation insulating layer.

20 Claims, 11 Drawing Sheets

(51) Int. Cl.
*H01L 21/02* (2006.01)
*H01L 21/465* (2006.01)

(56) References Cited

U.S. PATENT DOCUMENTS

| | | |
|---|---|---|
| 8,887,106 B2 | 11/2014 | Ho et al. |
| 2008/0203440 A1* | 8/2008 | Tsuchiaki .......... H01L 21/26506 257/255 |
| 2014/0282326 A1 | 9/2014 | Chen et al. |
| 2016/0020208 A1* | 1/2016 | Anderson ............. H01L 29/045 257/383 |

* cited by examiner

SEMICONDUCTOR DEVICE AND MANUFACTURING METHOD THEREOF

CROSS-REFERENCE TO RELATED APPLICATIONS

This application claims priority to U.S. Provisional Patent Application 62/273,361 filed Dec. 30, 2015, the entire disclosure of which is incorporated herein by reference.

TECHNICAL FIELD

The disclosure relates to a semiconductor integrated circuit, more particularly to a source/drain structure for a fin field effect transistor (FinFET) and its manufacturing process.

BACKGROUND

As the semiconductor industry has progressed into nanometer technology process nodes in pursuit of higher device density, higher performance, and lower costs, challenges from both fabrication and design issues have resulted in the use of a metal gate structure with a high-k (dielectric constant) material. The metal gate structure is often manufactured by using gate replacement technologies, and source and drain are formed in a recessed fin by using an epitaxial growth method. One of the challenges, however, in the present technologies is reducing current crowding at the source and drain and increasing the transistor's current drive ability.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

FIGS. 1-11 show exemplary views of various stages of a sequential manufacturing operation of a source/drain structure for a semiconductor FET device according to a first embodiment of the present disclosure. It is understood that additional operations may be provided before, during, and after processes shown by FIG. 1, and some of the operations described below can be replaced or eliminated for additional embodiments of the method. The order of the operations/processes may be interchangeable. In this disclosure, a source and a drain are interchangeably used and "source/drain" refers to one of or both of a source and a drain of an FET.

The following embodiments mainly describe a FinFET device as one example of the semiconductor device and the manufacturing method thereof, and the technologies described herein are also applicable to horizontal gate-all-around (GAA) type transistors or channel-on-oxide type transistors.

Figure 1:
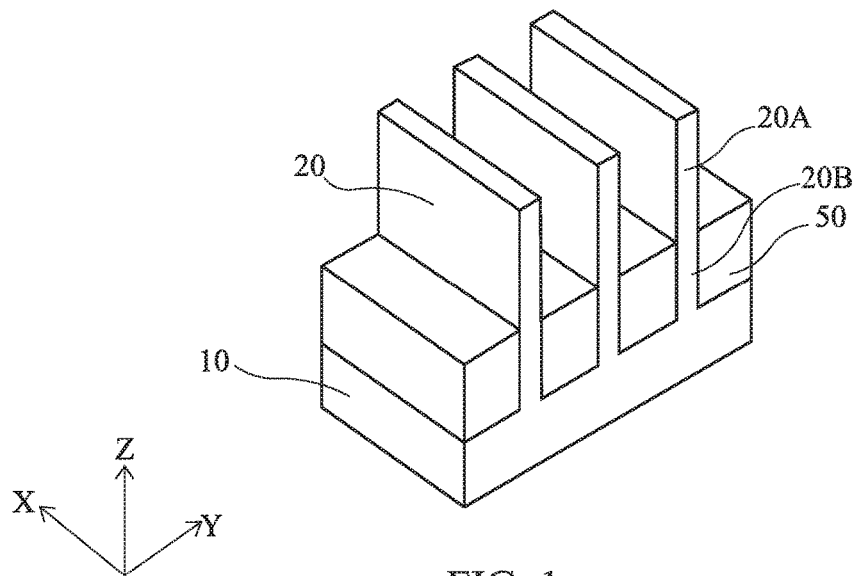
FIGS. 1, 2, 3A-3B, and 4-11 show exemplary views of various stages of a sequential manufacturing operation for a semiconductor FET device according to a first embodiment of the present disclosure.

FIG. 1 is an exemplary perspective view of one stage of the sequential manufacturing process of the semiconductor device according to the first embodiment of the present disclosure.

FIG. 1 shows a structure after fin structures are formed. One or more fin structures 20 are formed over a substrate 10, and protrude from an isolation insulating layer 50. In one embodiment, each of the fin structures 20 includes a well layer 20B and a channel layer 20A. In the present embodiment, the fin structures 20 include silicon. In other embodiments, the fin structures 20 include $Si_{1-x}Ge_x$, where x is 0.1 to 0.9. Hereinafter, $Si_{1-x}Ge_x$ may be simply referred to as SiGe.

To fabricate fin structures, a mask layer is formed over a substrate, for example, a Si substrate 10. The mask layer is formed by, for example, a thermal oxidation process and/or a chemical vapor deposition (CVD) process. The substrate 10 is, for example, a p-type silicon substrate with an impurity concentration in a range from about $1\times10^{15}$ cm$^{-3}$ to about $1\times10^{18}$ cm$^{-3}$. In other embodiments, the substrate 10 is an n-type silicon substrate with an impurity concentration in a range from about $1\times10^{15}$ cm$^{-3}$ to about $1\times10^{18}$ cm$^{-3}$. The mask layer includes, for example, a pad oxide (e.g., silicon oxide) layer and a silicon nitride mask layer.

Alternatively, the substrate 10 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The pad oxide layer may be formed by using thermal oxidation or a CVD process. The silicon nitride mask layer may be formed by a physical vapor deposition (PVD), such as a sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD) and/or other processes.

The thickness of the pad oxide layer is in a range from about 2 nm to about 15 nm and the thickness of the silicon nitride mask layer is in a range from about 2 nm to about 50 nm in some embodiments. A mask pattern is further formed over the mask layer. The mask pattern is, for example, a resist pattern formed by lithography operations.

By using the mask pattern as an etching mask, a hard mask pattern of the pad oxide layer and the silicon nitride mask layer is formed. The width of the hard mask pattern is in a range from about 5 nm to about 40 nm in some embodiments. In certain embodiments, the width of the hard mask patterns is in a range from about 4 nm to about 12 nm.

By using the hard mask pattern as an etching mask, the Si substrate is patterned into fin structures 20 by trench etching using a dry etching method and/or a wet etching method.

The width of the fin structure 20 is in a range from about 5 nm to about 40 nm in some embodiments, and is in a range from about 4 nm to about 12 nm in certain embodiments. The height of the fin structure 20 is in a range from about 100 nm to about 300 nm in some embodiments, and is in a range from about 50 nm to about 100 nm in other embodiments. When the heights of the fin structures are not uniform, the height from the substrate may be measured from the plane that corresponds to the average heights of the fin structures. The height of the channel layer 20A is in a range from about 35 nm to about 80 nm in some embodiments. The space between the fin structures 20 is in a range from about 5 nm to about 80 nm in some embodiments, and is in a range from about 7 nm to about 20 nm in other embodiments. One skilled in the art will realize, however, that the dimensions and values recited throughout the descriptions are merely examples, and may be changed to suit different scales of integrated circuits.

In FIG. 1, three fin structures 20 extending in the X direction are disposed adjacent to each other in the Y direction. However, the number of the fin structures is not limited to three. The numbers may be one, two, four or five or more. In addition, one of more dummy fin structures may be disposed adjacent to both sides of the fin structures 20 to improve pattern fidelity in patterning processes.

After forming the fin structures 20, an isolation insulating layer 50 is formed over the fin structures 20. The isolation insulating layer 50 includes one or more layers of insulating materials, for example, silicon dioxide, silicon oxynitride and/or silicon nitride formed by LPCVD (low pressure chemical vapor deposition), plasma-CVD or spin-on deposition of a flowable insulator. In the flowable deposition technique, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The flowable film may be doped with boron and/or phosphorous. The isolation insulating layer 50 may be formed by one or more layers of SOG, SiO, SiON, SiOCN or fluorine-doped silicate glass (FSG) in some embodiments.

After forming the isolation insulating layer 50 over the fin structures 20, a planarization operation is performed so as to remove part of the isolation insulating layer 50 and the mask layer (the pad oxide layer and the silicon nitride mask layer). The planarization operation may include a chemical mechanical polishing (CMP) and/or an etch-back process. Then, the isolation insulating layer 50 is further removed so that the channel layer 20A of the fin structure 20 is exposed, as shown in FIG. 1.

In certain embodiments, the partially removing the isolation insulating layer 50 may be performed using a wet etching process, for example, by dipping the substrate in hydrofluoric acid (HF). In another embodiment, the partially removing the isolation insulating layer 50 may be performed using a dry etching process. For example, a dry etching process using $CHF_3$ or $BF_3$ as etching gases may be used.

After forming the isolation insulating layer 50, a thermal process, for example, an anneal process, may be performed to improve the quality of the isolation insulating layer 50. In certain embodiments, the thermal process is performed by using rapid thermal annealing (RTA) at a temperature in a range from about 900° C. to about 1050° C. for about 1.5 seconds to about 10 seconds in an inert gas ambient, such as an $N_2$, Ar or $O_2$ ambient.

Figure 2:
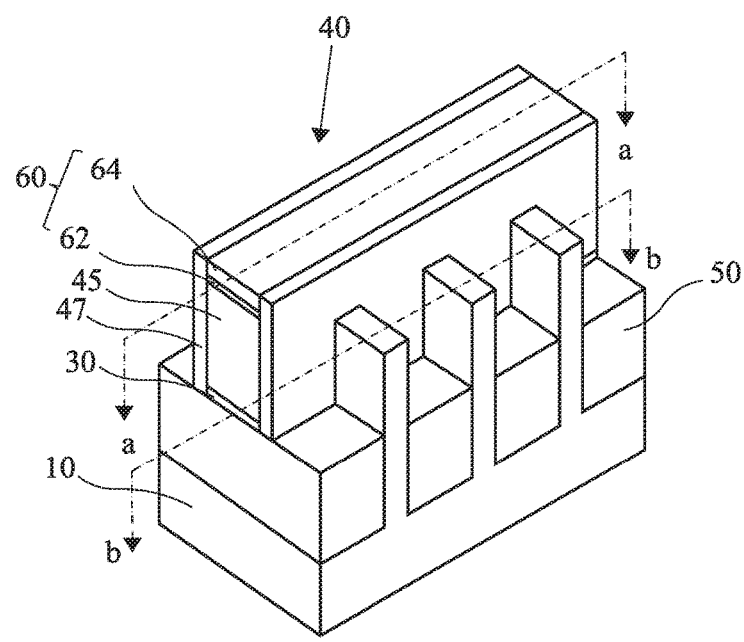
Figure 3A:
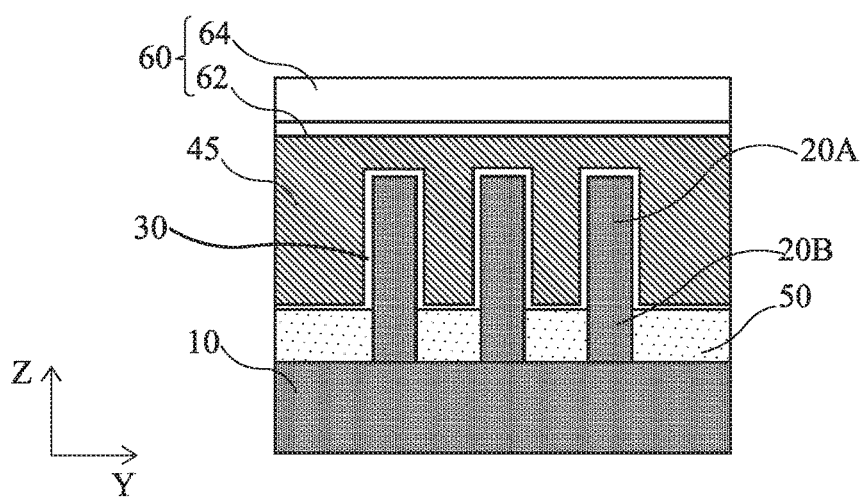
Figure 3B:
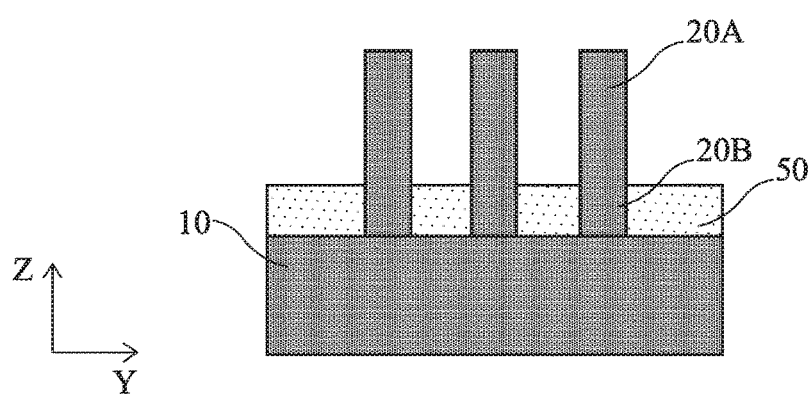

In the present embodiment, a gate replacement technology is employed. As shown in FIG. 2, a dummy gate structure 40 is formed over part of the fin structures 20. FIG. 2 is an exemplary perspective view of the FinFET device at one stage of the sequential fabrication process according to the first embodiment. FIG. 3A is an exemplary cross sectional view along the line a-a of FIG. 2 (a gate region), and FIG. 3B is an exemplary cross sectional view along the line b-b of FIG. 2 (a source/drain region). FIGS. 4-11 show exemplary cross sectional view corresponding to the line b-b of FIG. 2.

A dielectric layer and a polysilicon layer are formed over the isolation insulating layer 50 and the exposed fin structures 20A, and then patterning operations are performed so as to obtain a dummy gate structure 40 including a dummy gate electrode layer 45 made of polysilicon and a dummy gate dielectric layer 30. The patterning of the polysilicon layer is performed by using a hard mask 60 including a silicon nitride layer 64 formed over an oxide layer 62 in some embodiments. In other embodiments, the hard mask may include a silicon oxide layer formed over a nitride layer. The dummy gate dielectric layer 30 may be silicon oxide formed by CVD, PVD, ALD, e-beam evaporation, or other suitable process. In some embodiments, the gate dielectric layer 30 may include one or more layers of silicon oxide, silicon nitride, silicon oxy-nitride, or high-k dielectrics. In some embodiments, a thickness of the gate dielectric layer is in a range from about 5 nm to about 20 nm, and in a range from about 5 nm to about 10 nm in other embodiments.

The gate electrode layer 45 may comprise a single layer or multilayer structure. The dummy gate electrode layer 45 may be doped polysilicon with uniform or non-uniform doping. The dummy gate electrode layer 45 may be formed using a suitable process such as ALD, CVD, PVD, plating, or combinations thereof. In the present embodiment, the width of the dummy gate electrode layer 45 is in the range of about 30 nm to about 60 nm. In some embodiments, a thickness of the gate electrode layer is in a range from about 30 nm to about 50 nm.

The dummy gate structure 40 may include side-wall insulating layers 47 disposed over both main sides of the dummy gate electrode 45. The side-wall insulating layers 47 include one or more layers of silicon oxide, silicon nitride, silicon oxy-nitride, or other suitable material. The side-wall insulating layers 47 may comprise a single layer or multilayer structure. A blanket layer of a side-wall insulating material may be formed by CVD, PVD, ALD, or other suitable technique. Then, an anisotropic etching is performed on the side-wall insulating material to form a pair of side-wall insulating layers (spacers) 47 on two main sides of the gate structure. The thickness of the side-wall insulating layers 47 is in a range from about 1 nm to about 20 nm in some embodiments, and in a range from about 2 nm to about 10 nm in other embodiments.

Figure 4:
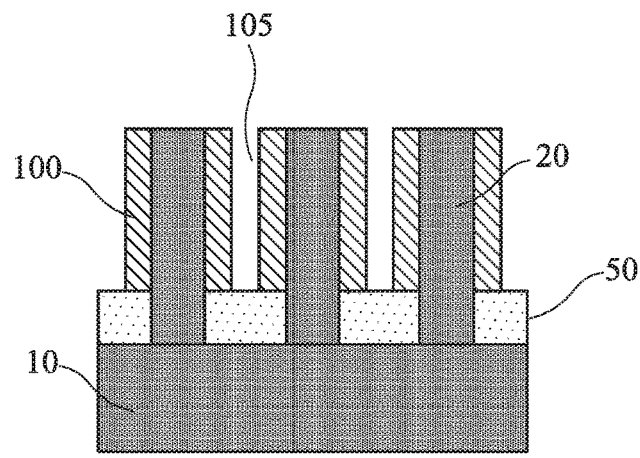

As shown in FIG. 4, spacer layers 100 are formed on sidewalls of the fin structures 20 in the source/drain (S/D) region. The spacer layers 100 include one or more layers of silicon oxide, silicon nitride, silicon oxy-nitride, or other suitable material. In this embodiment, a silicon nitride based material, such as SiN or SiCN is used. A blanket layer of an insulating material for the spacer layer is formed by CVD, PVD, ALD, or other suitable technique over the structure of FIG. 2. Then, an anisotropic etching is performed on the blanket layer to form a pair of spacer layers 100 on two main sidewalls of the fin structure and to leave a space 105 between the spacer layers. The width of the space 105 is in a range from about 4 nm to about 30 nm in some embodiments. The thickness of the spacer layers 100 is in a range from about 1 nm to about 10 nm in some embodiments, and in a range from about 2 nm to about 5 nm in other embodiments. In some embodiments, the spacer layers 100 are formed by the operations to form the side-wall insulating layers 47 for the dummy gate structure.

Figure 5:
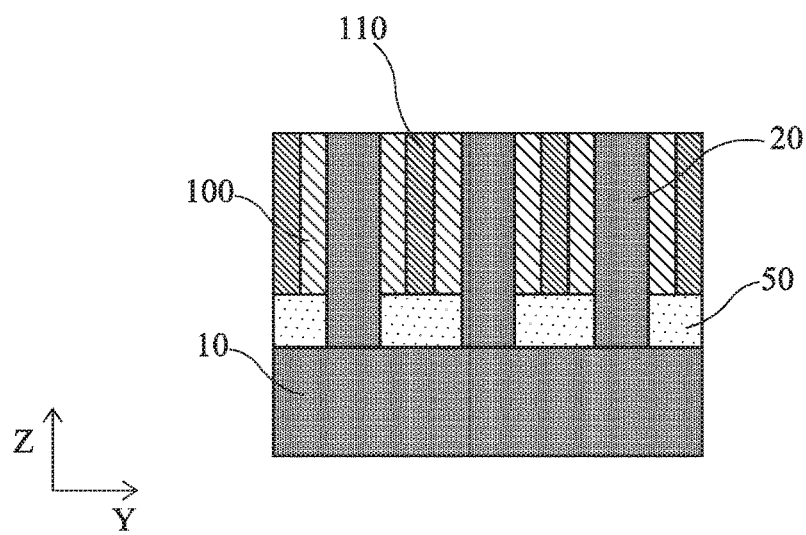

Subsequently, as shown in FIG. 5, first metal layers 110 are formed in the space 105 of the structure of FIG. 4. A blanket layer of the first metal material is formed over the structure of FIG. 4, and a planarization operation, such as an etch-back process, is performed so that the first metal material is filled in the space 105. The first metal layer 110 includes one or more of Co, Ti, Ta, W or Ni, or other suitable metal materials. The first metal layer is formed by CVD, PVD, ALD, or other suitable techniques.

Figure 6:
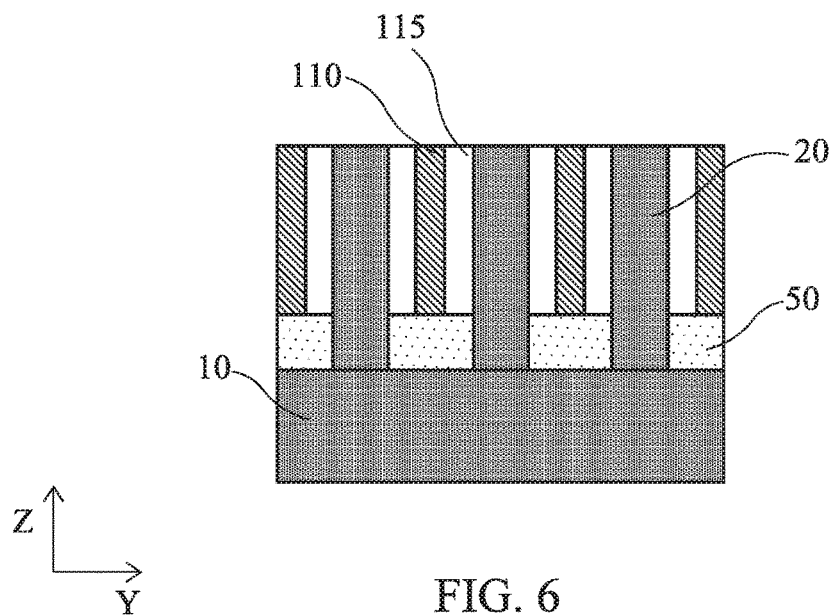

After the first metal layers 110 are formed, the spacer layers 100 are removed, by using a wet etching, thereby leaving spaces 115, as shown in FIG. 6.

Figure 7:
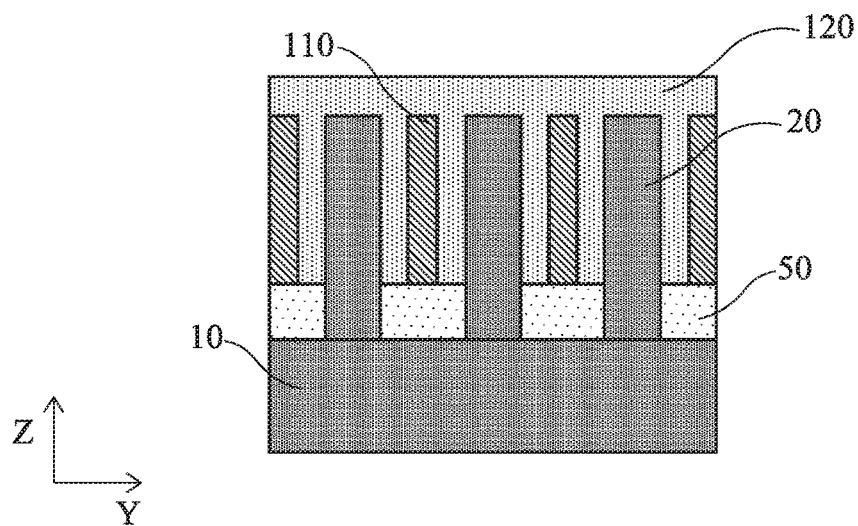

Next, as shown in FIG. 7, an amorphous layer 120 is formed over the structure shown in FIG. 6. The amorphous layer 120 is formed so as to fully fill the spaces 115 to be higher than the fin structures 20.

The amorphous layer 120 may be made of the same material as the fin structures 20 or a different material. When the fin structure 20 is made of Si and the FinFET is an n-type, the amorphous layer 120 may be made of Si or SiP. When the fin structure 20 is made of Si and the FinFET is a p-type, the amorphous layer 120 is made of Si, SiGe or SiGeB. When the fin structure 20 is made of SiGe and the FinFET is an n-type, the amorphous layer 120 may be made of Si or SiGe, and when the fin structure 20 is made of SiGe and the FinFET is a p-type, the amorphous layer 120 is made of Ge or SiGe.

The amorphous layer 120 is heavily doped with an appropriate dopant at an amount of about $2 \times 10^{20}$ cm$^{-3}$ to about $1 \times 10^{21}$ cm$^{-3}$. The dopant for a p-type FET includes boron, and the dopant for an n-type FET includes phosphorous and/or arsenic.

The amorphous layer 120 may be formed by a CVD method using $SiH_4$, $SiHCl_3$, $SiH_2Cl_2$ and/or $Si_2H_6$ as a source gas for amorphous silicon, or $GeH_4$ for amorphous SiGe. An ALD method may also be used. The amorphous layer 120 is produced by the pyrolysis (thermal decomposition of one of the abovementioned gases) at a temperature between, for example, about 520 and about 620 degrees Celsius and in the pressure range of about 2 to about 300 mTorr.

Figure 8:
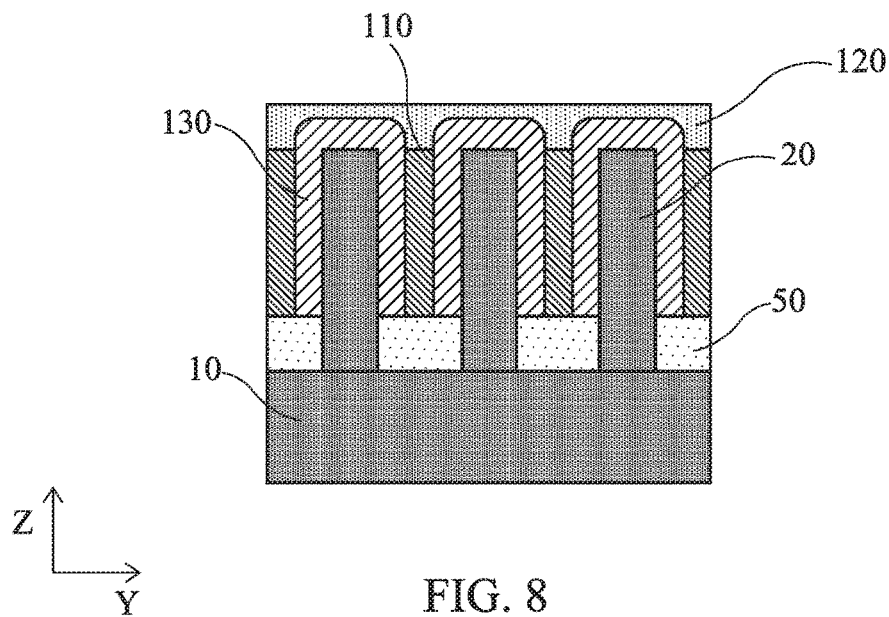

Subsequently, part of the amorphous layer 120 in contact with the fin structures 20 is recrystallized by a thermal operation, as shown in FIG. 8. This recrystallization is often called as solid-phase epitaxy.

In the recrystallization operations, the substrate with the dummy gate structure 40 and the fin structure 20 covered by the amorphous layer 120 is heated at a temperature of about 450° C. to about 650° C. in some embodiments, or at a temperature of about 550° C. to 600° C. in other embodiments, when the amorphous layer 120 is amorphous silicon. By this solid-phase epitaxy, a few nanometer layer of the amorphous layer 120 is recrystallized into recrystallized layer 130, by using the fin structure 20 (crystal silicon) as a seed layer. The thickness of the recrystallized layer 130 is in a range from about 0.5 nm to about 4 nm. The amorphous layer 120 formed on insulating layers is not recrystallized.

When the amorphous layer 120 is amorphous SiGe, the heating temperature is in a range from about 400° C. to 550° C. in some embodiments.

Figure 9:
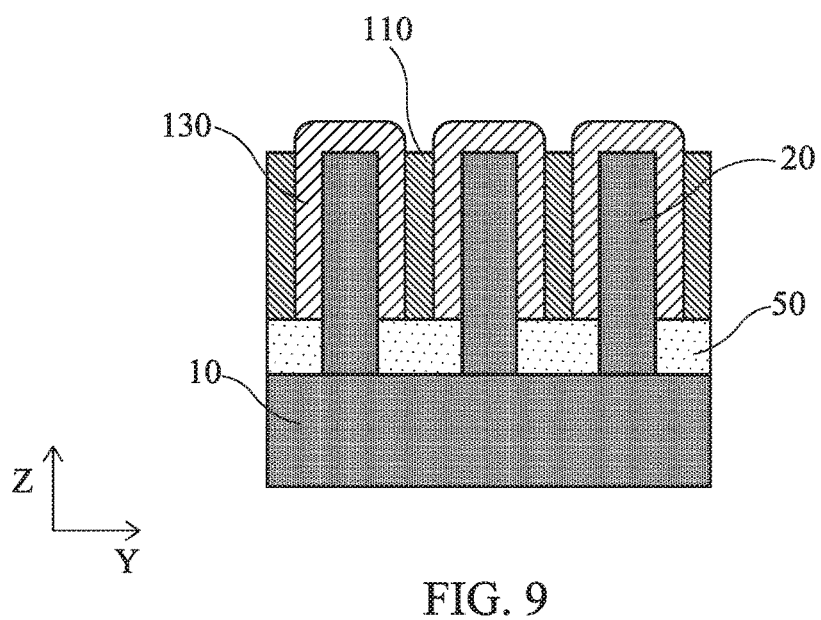

As shown in FIG. 9, the recrystallized layer 130 grows substantially uniformly on the top and the side faces of the exposed fin structure 20. The difference of the thickness of the grown recrystallized layer 120 between the side face and the top face may be about 0.2 nm to about 1 nm. If a vapor phase epitaxy is used instead of solid-phase epitaxy as described above, an epitaxially grown layer would grow more laterally than vertically due to different growth rates for crystal orientations of Si, thereby forming a "diamond" shape cross section.

After the recrystallization operation, the remaining amorphous layers 120 that are not recrystallized are removed by, for example, wet etching operations. In case of wet etching, dilute $HNO_3$ and HF is used as an etching solution. A tetramethylammonium hydroxide (TMAH) solution, ammonia ($NH_4OH$) or a potassium hydroxide (KOH) solution or a CF₄O₂ plasma may also be used. Dry etching may be used to remove the non-crystallized amorphous layer.

Figure 10:
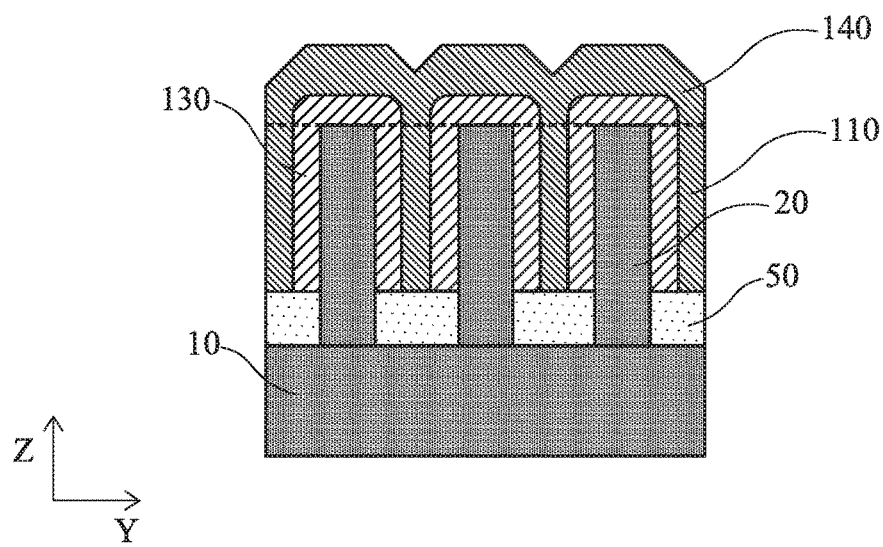

After the remaining, non-used amorphous layers 120 are removed, a second metal layer 140 is formed over the structure of FIG. 9, as shown in FIG. 10. The metal material for the second metal layer 140 is the same as the first metal layer 110 in this embodiment. In other embodiments, a different metal material is used.

Figure 11:
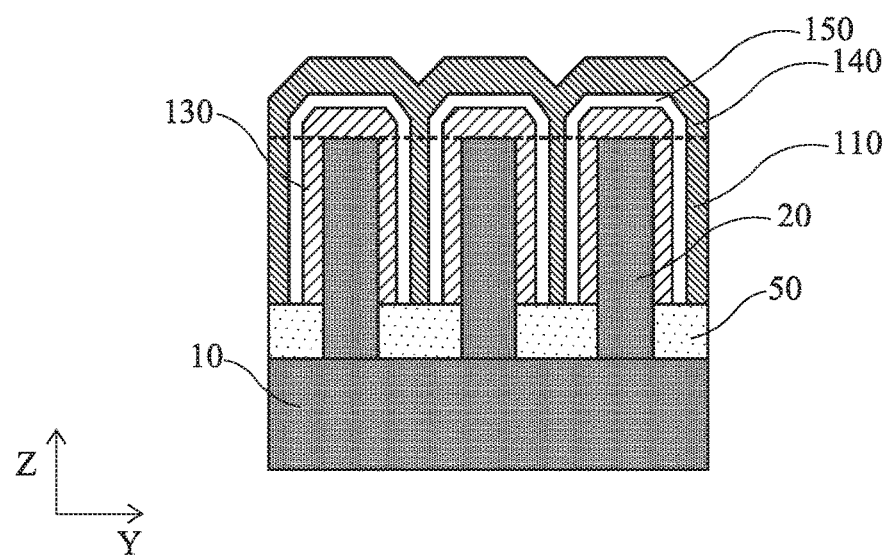

Subsequently, as shown in FIG. 11, silicide layers 150 are formed between the recrystallized layer 130 and the first and second metal layers 110, 140.

To form the silicide layer 150, a thermal operation, such as a rapid thermal annealing (RTA) operation, is performed. The substrate 10 is heated at about 900° C. to about 1100° C. when the first and second metal layers are made of W, at about 600° C. to about 800° C. when the first and second metal layers are made of Co, at about 700° C. to about 900° C. when the first and second metal layers are made of Ti, or at about 400° C. to about 600° C., when the first and second metal layers are made of Ni.

As shown in FIG. 11, a part of the recrystallized layer 130 becomes the silicide layers 150. The thickness of the silicide layer 150 is in a range from 1 nm to 5 nm in some embodiments. When the recrystallized layer 130 is thin, the entire recrystallized layer 130 becomes the silicide layers 150, and further part of the fin structure 20 also becomes the silicide layers 150. In such cases, the thickness of the silicide layers 150 is in a range from about 5 nm to about 15 nm in some embodiments.

As shown in FIG. 11, since the recrystallized layers 130 are substantially uniformly grown over the exposed fin structure 20, the silicide layers 150 are also substantially uniformly formed. The difference of the thickness of the silicide layer 150 between the side face and the top face of the fin structure 20 is about 0.2 nm to about 1 nm in some embodiments.

After the silicide layers 150 are formed, a dielectric layer is formed, and then the dummy gate electrode layer 45 and the dummy dielectric layer 30 are removed, by appropriate etching processes, respectively, to form an opening. A metal gate structure is formed in the opening created by removing the dummy gate structure. A gate dielectric layer and a metal gate layer are formed in the opening. A gate dielectric layer is formed over an interface layer disposed over the channel layer of the fin structure. The interface layer may include silicon oxide with a thickness of 0.2 nm to 1.5 nm in some embodiments. The silicon oxide interface layer may be formed by oxidizing the Si channel layer. In other embodiments, the thickness of the interface layer is in a range about 0.5 nm to about 1.0 nm. The gate dielectric layer includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer 75 is formed by, for example, chemical vapor deposition (CVD), physical vapor deposition (PVD), atomic layer deposition (ALD), high density plasma CVD (HDPCVD), or other suitable methods, and/or combinations thereof. A metal gate electrode is formed over the gate dielectric layer. The metal gate electrode include one or more layers of any suitable metal material, such as aluminum, copper, titanium, tantalum, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In certain embodiments of the present disclosure, one or more work function adjustment layers may be interposed between the gate dielectric layer and the gate electrode. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the p-type FinFET, one or more of TiAlC, Al, TiAl, TaN, TaAlC, TiN, TiC and Co may be used as the work function adjustment layer.

In the above fabrication process, when the S/D structures for n-type FinFETs are fabricated, the regains where p-type FETs are formed are covered by a protective layer, such as SiN. Similarly, when the S/D structures for p-type FinFETs are fabricated, the regions where the n-type FETs are formed are covered by a protective layer.

It is understood that further CMOS processes are performed to form various features such as contacts/vias, interconnect metal layers, dielectric layers, passivation layers, etc.

In the present embodiment, since the first metal layer is formed before the recrystallization of the amorphous layer, it is possible to increase packing density (to reduce fin pitch/space) in the source/drain structure. Further, by using a solid phase epitaxy, a recrystallized layer substantially uniformly grows on the top and the side faces of the exposed fin structure. The recrystallized layer fully covers the exposed fin structure, the silicide layer also fully covers the recrystallized layer, and therefore the S/D contact plug can cover the entire source/drain regions of the fin structure. Accordingly, the contact resistance between the S/D metal electrode layers and the source/drain regions can be reduced.

Figure 12:
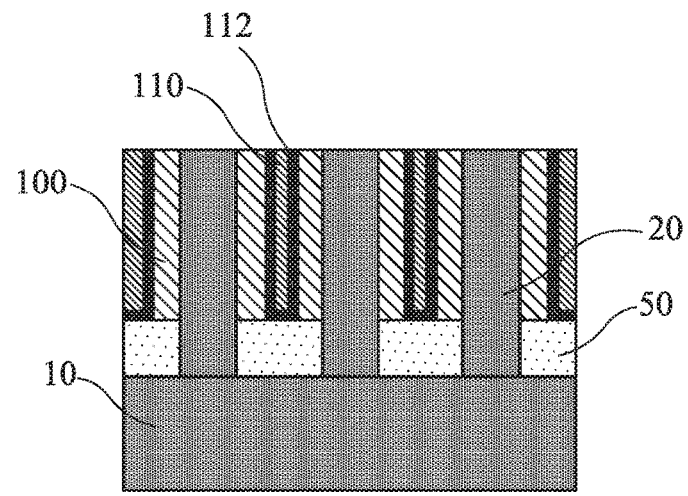
FIGS. 12-14 show exemplary views of various stages of a sequential manufacturing operation for a semiconductor FET device according to a second embodiment of the present disclosure.
Figure 13:
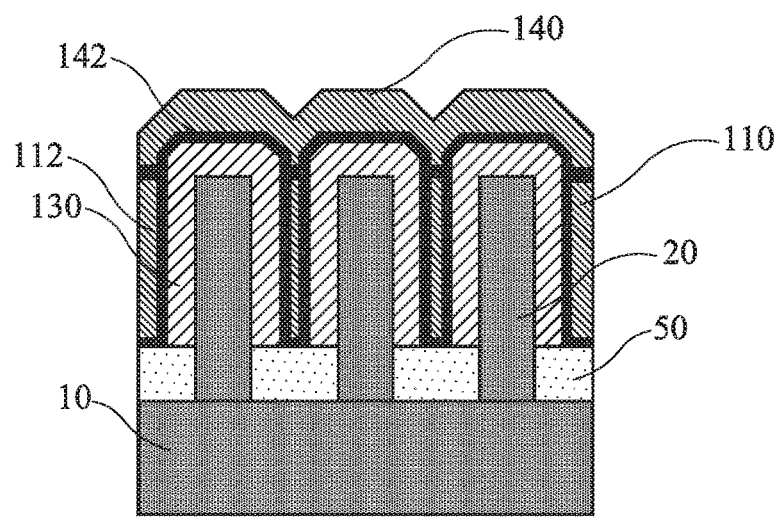
Figure 14:
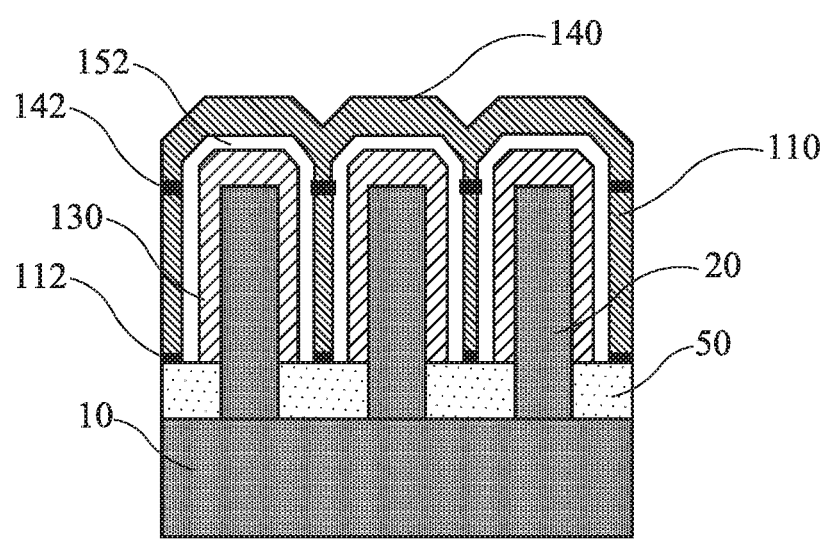

FIGS. 12-14 show exemplary views of various stages of a sequential manufacturing operation for a semiconductor FET device according to a second embodiment of the present disclosure. The configurations, materials and/or processes as described with the first embodiment may be applied to the second embodiment, and the details thereof may be omitted.

In the second embodiment, more than one metal material is used to fill the space 105. After the structure of FIG. 4 is formed, a thin third metal layer 112 is formed and then the first metal layer 110 is formed, followed by the planarization operation, thereby obtaining the structure shown in FIG. 12. The metal material for the third metal layer 112 is different from the metal material for the first metal layer. The third metal layer 112 includes one or more of Co, Ti, W or Ni, or other suitable metal materials. The third metal layer is formed by CVD, PVD, ALD, or other suitable techniques. The third metal layer 112 is a metal having a lower silicide formation temperature and forming a higher quality of silicide than the first metal layer 110. When the first metal layer 110 is W, the third metal layer 112 is Ni and/or Ti for an n-type FET, and Ni, Ti and/or Ta for a p-type FET. The thickness of the third metal layer 112 is smaller than the thickness of the first metal layer and is in a range from about 0.5 nm to about 3 nm in some embodiments.

After the planarization operation on the first and third metal layer, the fabrication operations descried with FIGS. 6-9 are performed.

Then, as shown in FIG. 13, a fourth metal layer 142 is formed and the second metal layer 140 is further formed on the fourth metal layer 142. The fourth metal layer 142 is a metal having a lower silicide formation temperature and forming a higher quality of silicide than the first and/or second metal layers. The second metal layer 140 is a material having a lower resistivity than the third and/or fourth metal layers. The metal material for the second metal layer 140 is the same as the first metal layer 110 and the metal material for the third metal layer 112 is the same as the fourth metal layer 142 in this embodiment. In other embodiments, different metal materials are used. The thickness of the fourth metal layer 142 is in a range from about 0.5 nm to about 3 nm in some embodiments.

Subsequently, as shown in FIG. 14, silicide layers 152 are formed between the recrystallized layer 130 and the third and fourth metal layers 112, 142, by the similar thermal operation described with FIG. 11.

In the second embodiment, by using a metal material having a lower silicide formation temperature and forming a higher quality of silicide as a silicide source (e.g., third and fourth metal layers) and using a metal material having a lower resistivity as the contact metal layer covering the silicide layer (e.g., first and second metal layers), it is possible to reduce the overall process temperature and thermal budget, while achieving a good electrical conductivity at the soured/drain. In particular, the contact resistance to the S/D contact plug can be lowered.

Figure 15:
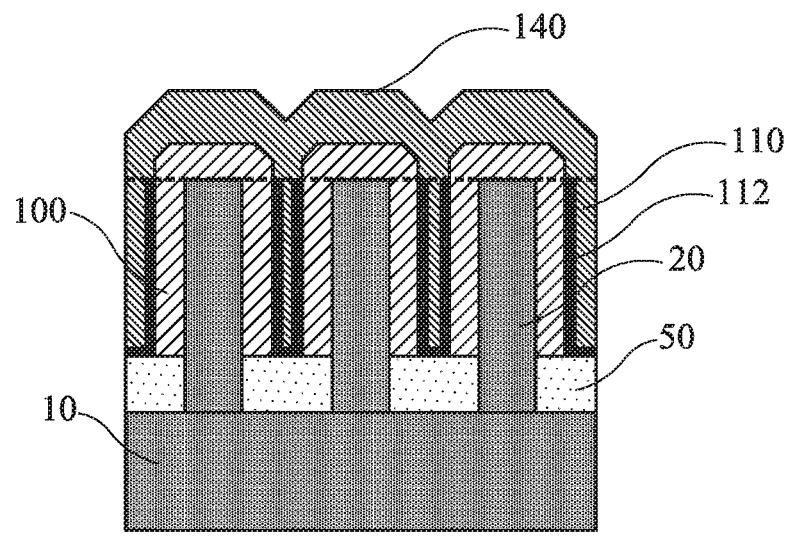
FIGS. 15 and 16 show exemplary views of various stages of a sequential manufacturing operation for a semiconductor FET device according to a third embodiment of the present disclosure.
Figure 16:
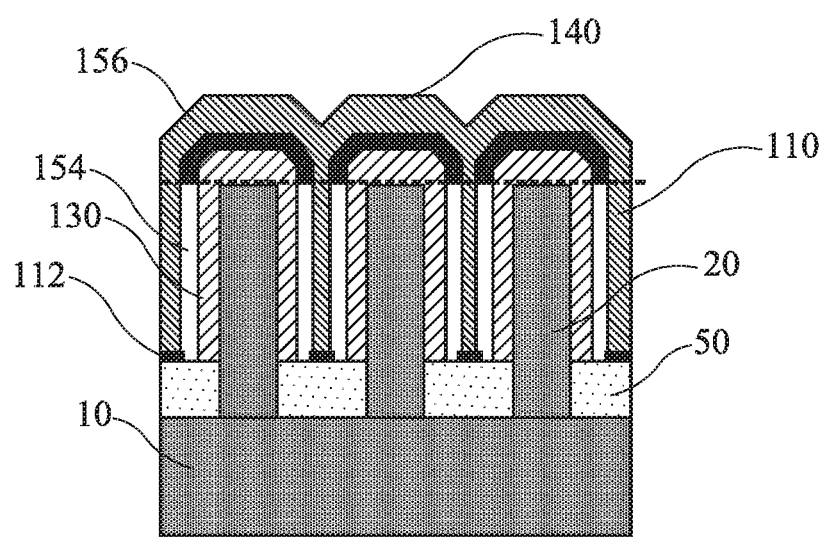

FIGS. 15-16 show exemplary views of various stages of a sequential manufacturing operation for a semiconductor FET device according to a third embodiment of the present disclosure. The configurations, materials and/or processes as described with the first and second embodiments may be applied to the third embodiment, and the details thereof may be omitted.

Similar to the second embodiment, two metal layers 110 and 112 are formed as shown in FIG. 12. After the planarization operation on the first and third metal layer, the fabrication operations descried with FIGS. 6-9 are performed.

Then, as shown in FIG. 15, the second metal layer 140 is formed, without forming a fourth metal layer. The second metal layer 140 is a material having a lower resistivity than the third metal layer 112. The metal material for the second metal layer 140 is the same as the first metal layer 110 in this embodiment. In other embodiments, a different metal material is used.

Subsequently, as shown in FIG. 16, a lower silicide layer 154 is formed between the recrystallized layer 130 and the third metal layer 112 and an upper silicide layer 156 is formed between the recrystallized layer 130 and the second metal layer 140, by the similar thermal operation described with FIG. 11.

In the third embodiment, the similar advantages to the second embodiment can be obtained. In the third embodiment, the contact resistance to the S/D contact plug can be further lowered than the second embodiment. Although the quality of the upper silicide layer 156 may be lower than the quality of the lower silicide layer 154, the area/volume of the upper silicide layer 156 is much smaller than the lower silicide layer 154, and therefore the effect of the upper silicide layer 156 on the electrical properties of the S/D structure is limited.

FIGS. 17A-17H show exemplary views of various stages of a sequential manufacturing operation for a semiconductor FET device according to a fourth embodiment of the present disclosure. In the fourth embodiment, an S/D structure for one fin structure is fabricated. The configurations, materials and/or processes as described with the first to third embodiments may be applied to the fourth embodiment, and the details thereof may be omitted.

Figure 17A:
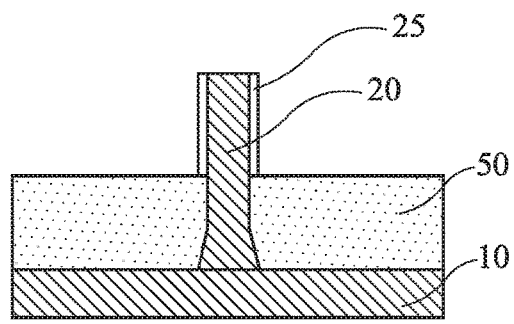
FIGS. 17A-17H show exemplary views of various stages of a sequential manufacturing operation for a semiconductor FET device according to a fourth embodiment of the present disclosure.

In FIG. 17A, similar to FIG. 4, spacer layers 25 are formed on sidewalls of the fin structure 20 in the source/drain (S/D) region.

Figure 17B:
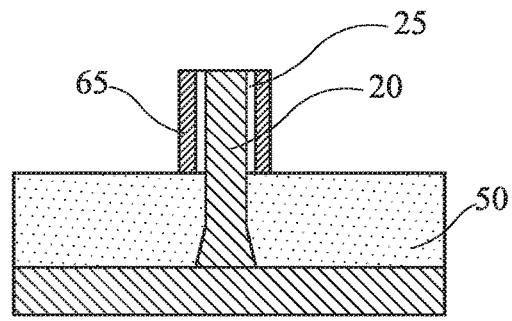

In FIG. 17B, similar to FIG. 5, first metal layers 65 are formed on the sidewalls of the spacer layers 25.

Figure 17C:
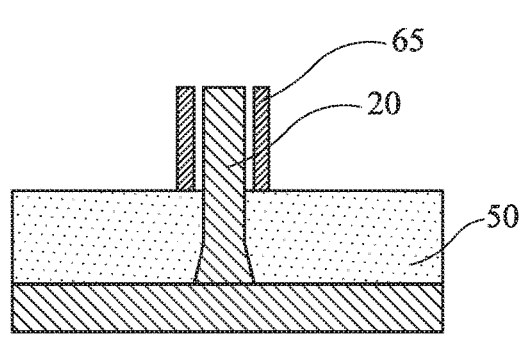

In FIG. 17C, similar to FIG. 6, the spacer layer 25 are removed.

Figure 17D:
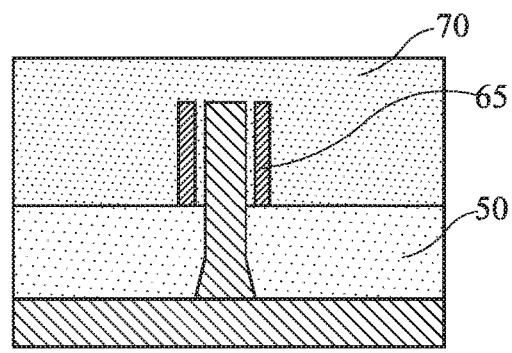

In FIG. 17D, similar to FIG. 7, an amorphous layer 70 is formed.

Figure 17E:
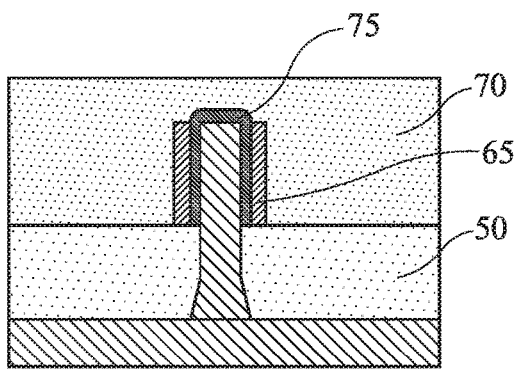

In FIG. 17E, similar to FIG. 8, portions of the amorphous layer 70 in contact with the fin structure 20 are recrystallized to form a recrystallized layer 75.

Figure 17F:
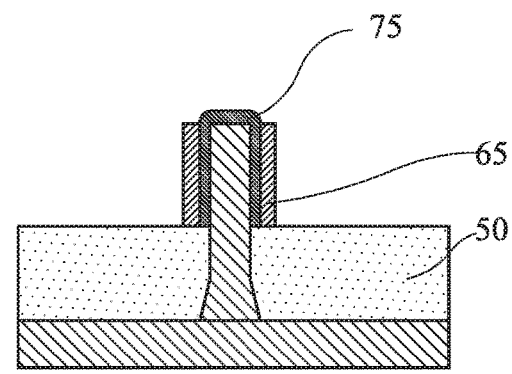

As shown in FIG. 17F, similar to FIG. 9, the remaining, unused amorphous layer 70 is removed.

Figure 17G:
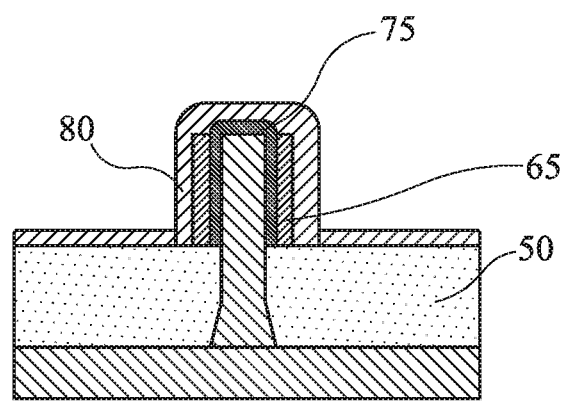

As shown in FIG. 17G, similar to FIG. 10, a second metal layer 80 is formed.

Figure 17H:
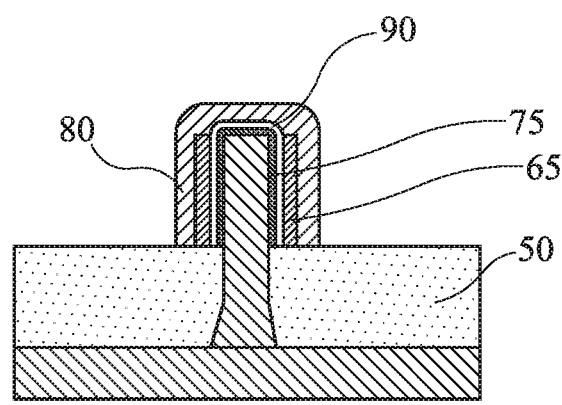

As shown in FIG. 17H, similar to FIG. 11, by the thermal operation, a silicide layer 90 is formed. The second metal layer 80 formed on the surface of the isolation insulating layer 50 is be removed by appropriate etching operations, including wet and/or dry etching.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device including a FinFET, a first fin structure and a second fin structure are formed over a substrate. The first and second fin structures extend in a first direction and protrude from an isolation insulating layer. A gate structure is formed over part of the first and second fin structures. The gate structure extends in a second direction perpendicular to the first direction. Sidewall spacers are formed on both major side surfaces of each of the first and second fin structures not covered by the gate structure. First metal layers are formed on the sidewall spacers, thereby filling a space between the first and second fin structures. After forming the first metal layers, the sidewall spacers are removed. After removing the sidewall spacers, an amorphous layer in contact with the fin structure is formed. A recrystallized layer is formed by partially recrystallizing the amorphous layer on the fin structure. A remaining amorphous layer which is not recrystallized is removed. After removing the remaining amorphous layer, a second metal layer is formed. Silicide layers are formed by a silicide reaction between the recrystallized layer and the first metal layers and the second metal layer.

In accordance with another aspect of the present disclosure, in a method of manufacturing a semiconductor device including a FinFET, a first fin structure and a second fin structure are formed over a substrate. The first and second fin structures extend in a first direction and protrude from an isolation insulating layer. A gate structure is formed over part of the first and second fin structures. The gate structure extends in a second direction perpendicular to the first direction. Sidewall spacers are formed on both major side surfaces of each of the first and second fin structures not covered by the gate structure. First metal layers are formed on the sidewall spacers and second metal layers on the first metal layers, thereby filling a space between the first and second fin structures. After forming the first and second metal layers, the sidewall spacers are removed. After removing the sidewall spacers, an amorphous layer in contact with the fin structure is formed. A recrystallized layer is formed by partially recrystallizing the amorphous layer on the fin structure. A remaining amorphous layer which is not recrystallized is removed. After removing the remaining amorphous layer, a third metal layer is formed. Silicide layers, formed by a silicide reaction between the recrystallized layer and the first metal layers and the third metal layer, are formed.

In accordance with another aspect of the present disclosure, a semiconductor device includes a fin structure disposed over a substrate, a gate structure and a source. The fin structure includes an upper layer being exposed from an isolation insulating layer. The gate structure disposed over part of the upper layer of the fin structure. The source includes the upper layer of the fin structure not covered by the gate structure. The upper layer of the fin structure of the source is covered by a crystal semiconductor layer. The crystal semiconductor layer is covered by a silicide layer formed by Si and a first metal element. The silicide layer is covered by a first metal layer. A second metal layer made of the first metal element is disposed between the first metal layer and the isolation insulating layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device including a FinFET, the method comprising:
    forming a first fin structure and a second fin structure over a substrate, the first and second fin structures extending in a first direction and protruding from an isolation insulating layer;
    forming a gate structure over part of the first and second fin structures, the gate structure extending in a second direction perpendicular to the first direction;
    forming sidewall spacers on opposing major side surfaces of each of the first and second fin structures not covered by the gate structure;
    forming first metal layers on the sidewall spacers, thereby filling a space between the first and second fin structures;
    after forming the first metal layers, removing the sidewall spacers;
    after removing the sidewall spacers, forming an amorphous layer in contact with the first and second fin structures;
    forming a recrystallized layer by partially recrystallizing the amorphous layer on the first and second fin structures;
    removing a remaining amorphous layer which is not recrystallized;
    after removing the remaining amorphous layer, forming a second metal layer; and
    forming silicide layers formed by a silicide reaction between the recrystallized layer and the first metal layers and the second metal layer.

2. The method of claim 1, wherein the first metal layers include one or more of W, Co, Ti and Ni.

3. The method of claim 2, wherein the second metal layer includes one or more of W, Co, Ti and Ni.

4. The method of claim 2, wherein the second metal layer is made of a same material as the first metal layers.

5. The method of claim 2, wherein entire top and side faces of an upper layer of each of the first and second fin structures not covered by the gate structure are covered by the recrystallized layer.

6. The method of claim 1, wherein the amorphous layer includes amorphous silicon.

7. The method of claim 6, wherein the amorphous silicon is doped with impurities at an amount of $2 \times 10^{20}$ cm$^{-3}$ to $1 \times 10^{21}$ cm$^{-3}$.

8. The method of claim 1, wherein in the removing the remaining amorphous layer, the remaining amorphous layer is removed by wet etching.

9. The method of claim 1, wherein the forming the recrystallized layer is performed at a temperature of 500° C. to 650° C.

10. A method of manufacturing a semiconductor device including a FinFET, the method comprising:
    forming a fin structure over a substrate, the fin structure extending in a first direction and protruding from an isolation insulating layer;
    forming a gate structure over part of the fin structure, the gate structure extending in a second direction perpendicular to the first direction;
    forming sidewall spacers on opposing major side surfaces of the fin structure not covered by the gate structure;
    forming first metal layers on the sidewall spacers;
    after forming the first metal layers, removing the sidewall spacers;
    after removing the sidewall spacers, forming an amorphous layer in contact with the fin structure;
    forming a recrystallized layer by partially recrystallizing the amorphous layer on the fin structure;
    removing a remaining amorphous layer which is not recrystallized;
    after removing the remaining amorphous layer, forming a second metal layer; and
    forming silicide layers formed by a silicide reaction between the recrystallized layer and the first metal layers and the second metal layer.

11. The method of claim 10, wherein the first metal layers include one or more of W, Co, Ti and Ni.

12. The method of claim 11, wherein the second metal layer includes one or more of W, Co, Ti and Ni.

13. The method of claim 11, wherein the second metal layer is made of a same material as the first metal layers.

14. The method of claim 11, wherein entire top and side faces of an upper layer of the fin structure not covered by the gate structure are covered by the recrystallized layer.

15. The method of claim 10, wherein the amorphous layer includes amorphous silicon.

16. The method of claim 15, wherein the amorphous silicon is doped with impurities at an amount of $2 \times 10^{20}$ cm$^{-3}$ to $1 \times 10^{21}$ cm$^{-3}$.

17. The method of claim 10, wherein in the removing the remaining amorphous layer, the remaining amorphous layer is removed by wet etching.

18. The method of claim 10, wherein the forming the recrystallized layer is performed at a temperature of 500° C. to 650° C.

19. A method of manufacturing a semiconductor device including a FinFET, the method comprising:
    forming fin structures over a substrate, the fin structures extending in a first direction and protruding from an isolation insulating layer;

forming a gate structure over part of the fin structures, the gate structure extending in a second direction perpendicular to the first direction;

forming sidewall spacers on opposing major side surfaces of each of the fin structures not covered by the gate structure;

forming first metal layers on the sidewall spacers, thereby filling one or more spaces between the fin structures;

after forming the first metal layers, removing the sidewall spacers;

after removing the sidewall spacers, forming an amorphous layer in contact with the fin structures;

forming a recrystallized layer by partially recrystallizing the amorphous layer on the fin structures;

removing a remaining amorphous layer which is not recrystallized;

after removing the remaining amorphous layer, forming a second metal layer; and forming silicide layers formed by a silicide reaction between the recrystallized layer and the second metal layers and at least a part of the first metal layer.

20. The method of claim 19, wherein a part of the first metal layer remains after the silicide layers are formed.

\* \* \* \* \*